US011405028B1

(12) United States Patent
Sonntag et al.

(10) Patent No.: US 11,405,028 B1
(45) Date of Patent: Aug. 2, 2022

(54) ACCURATE PEAK DETECTOR

(71) Applicant: Silicon Laboratories Inc., Austin, TX (US)

(72) Inventors: Jeffrey L. Sonntag, Weaverville, NC (US); Rex Wong Tak Ying, Singapore (SG); Yushan Jiang, Singapore (SG)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 17/490,815

(22) Filed: Sep. 30, 2021

(51) Int. Cl.
*H03K 5/1532* (2006.01)
*H03K 17/687* (2006.01)

(52) U.S. Cl.
CPC ....... *H03K 5/1532* (2013.01); *H03K 17/6871* (2013.01)

(58) Field of Classification Search
CPC .................. H03K 5/1532; H03K 17/6871
See application file for complete search history.

(56) References Cited

U.S. PATENT DOCUMENTS

| | | | | |
|---|---|---|---|---|
| 5,594,384 | A * | 1/1997 | Carroll | H03D 1/18 455/337 |
| 6,239,625 | B1 * | 5/2001 | Abe | H03D 1/18 327/13 |
| 9,939,467 | B1 * | 4/2018 | Ciubotaru | G01R 21/01 |
| 2007/0030034 | A1 * | 2/2007 | Kurtzman | G01R 19/04 327/58 |

OTHER PUBLICATIONS

Meyer, Robert G. "Low Power Monolithic RF Peak Detector Analysis." *IEEE Journal of Solid-State Circuits*, vol. 30, No. 1, pp. 65-67, Jan. 1995.
Nilsson, Emil et al. "Envelope Detector Sensitivity and Blocking Characteristics." *2011 20th European Conference on Circuit Theory and Design (ECCTD)*. 2011, pp. 773-776.
Jayaraman, Karthik et al. "Design & Analysis of 1-60GHz, RF CMOS Peak Detectors for LNA Calibration." *2009 International Symposium on VLSI Design, Automatin and Test*. 2009. pp. 311-314.

* cited by examiner

*Primary Examiner* — Metasebia T Retebo
(74) *Attorney, Agent, or Firm* — Gary Stanford; Huffman Law Group, PC

(57) ABSTRACT

A peak detector including an input transistor, an isolation transistor, at least one load transistor, a buffer, a control transistor, a current source and at least one resistor. The isolation transistor isolates the input and load transistors from the supply voltage for power supply rejection. The buffer, control transistor, current source and resistor(s) bias the input transistor to remain in a saturation region and each load transistor to remain in a triode region. The buffer may be a unity gain buffer. The control transistor may match each load transistor with matching threshold voltages. An input bias circuit may be included to bias an input node to a direct-current voltage. The load transistor(s) may be biased to have so that the output voltage is proportional to a peak voltage of the input node. The peak detector may be configured to detect multiple inputs and may have shared circuitry.

20 Claims, 2 Drawing Sheets

ACCURATE PEAK DETECTOR

BACKGROUND OF THE INVENTION

Field of the Invention

The present invention relates in general to peak detectors, and more particularly to a highly accurate peak detector with a high power supply rejection ratio that may be used for radio frequency (RF) signals.

Description of the Related Art

A conventional RF peak detector (RFPKD) has an input transistor having a control terminal receiving an input voltage through a coupling capacitor, and an active load coupled between a current terminal of the input transistor providing the peak output signal and a supply reference voltage, such as ground. The conventional RFPKD has several disadvantages. Some RF signals, such as, for example, orthogonal frequency division modulation (OFDM) signals, and a varying peak level causing the modulation of the input transistor. For a MOS type input transistor, as the peak voltage of the input varies, the drain-to-source voltage (VDS) exhibits a modulation effect. The load may also be configured as a MOS type transistor, which also exhibits the modulation effect for certain RF signals. When the input peak voltage is large, the load transistor operates in its saturation region, whereas when the input peak voltage is small, the load transistor operates in its subthreshold region. The changing operating region of the load transistor changes its I-V characteristic which degrades RFPKD performance. In addition, as the supply voltage varies, VDS of the input transistor also varies, resulting in poor power supply rejection ratio (PSRR). The conventional RFPKD also only has one input, so that it is not suitable for power measurement.

SUMMARY OF THE INVENTION

A peak detector according to one embodiment including an input transistor, an isolation transistor, at least one load transistor, a buffer, a control transistor, a current source and at least one resistor. The input transistor has a control terminal coupled to an input node, has a first current terminal coupled to an isolation node, and has a second current terminal coupled to an output node. The isolation transistor has current terminals coupled between a supply voltage and the isolation node and has a control terminal coupled to a first one of multiple gate nodes. Each load transistor has current terminals coupled between the output node and a supply reference node and has a control terminal coupled to a corresponding gate node. The buffer has an input coupled to the output node and has an output coupled to a buffer node. The control transistor has a control terminal and a first current terminal coupled to a last gate node and has a second current terminal coupled to the buffer node. The current source is configured to provide a bias current into the first gate node, and each resistor is coupled between the first and last gate nodes.

Each of the transistors may be an NMOS transistor. The input transistor may be biased in a saturation region and each load transistor may be biased in a triode region. The isolation transistor and the current source provide power supply rejection. Each load transistor may match the control transistor with matching threshold voltages. The buffer comprises a unity gain buffer having a negative input and an output coupled together at the buffer node and having a positive input coupled to the output node.

An input bias circuit may include a second current source configured to provide current to a bias node, a bias transistor having a first current terminal and a control terminal coupled together at the bias node and having a second current terminal coupled to the supply reference node, and a second resistor coupled between the bias node and the input node. The input and bias transistors may match with matching threshold voltages.

The buffer, the control transistor, the current source, and the at least one resistor collectively bias each load transistor with a buffered version of an output voltage generated on the output node to operate as a nonlinear resistor that corrects nonlinearities of the input transistor and each load transistor. The buffer, the control transistor, the current source, and the at least one resistor collectively bias each load transistor so that it has a current that is proportional to the square of an output voltage on the output node in which the output voltage is proportional to a peak voltage of the input node.

The peak detector may be configured to detect multiple input voltages. The one or more resistors, the current source, the buffer, and the control transistor may be shared among multiple input circuits, each including an input transistor, an isolation transistor and one or more load transistors. One or more of the load transistors may also be shared among the input circuits.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A peak detector including an input transistor, a load transistor, a buffer and other biasing devices that biases the input transistor to remain in the saturation region and that biases the load transistor to remain in the triode region regardless of the input signal. The input and load transistors do not change operating regions during operation, and do not exhibit the VDS (drain-to-source voltage) modulation effect. An isolation transistor is included and biased to isolate the input and load transistors from changes in the supply voltage to provide good power supply rejection. The input circuitry may be duplicated to detect any number of inputs, in which switch circuitry is added to select one of the inputs for peak detection. In the switched configuration, a current source, biasing resistors and a resistive device, and the buffer may be shared among the multiple input circuits to save power and space.

Figure 1:
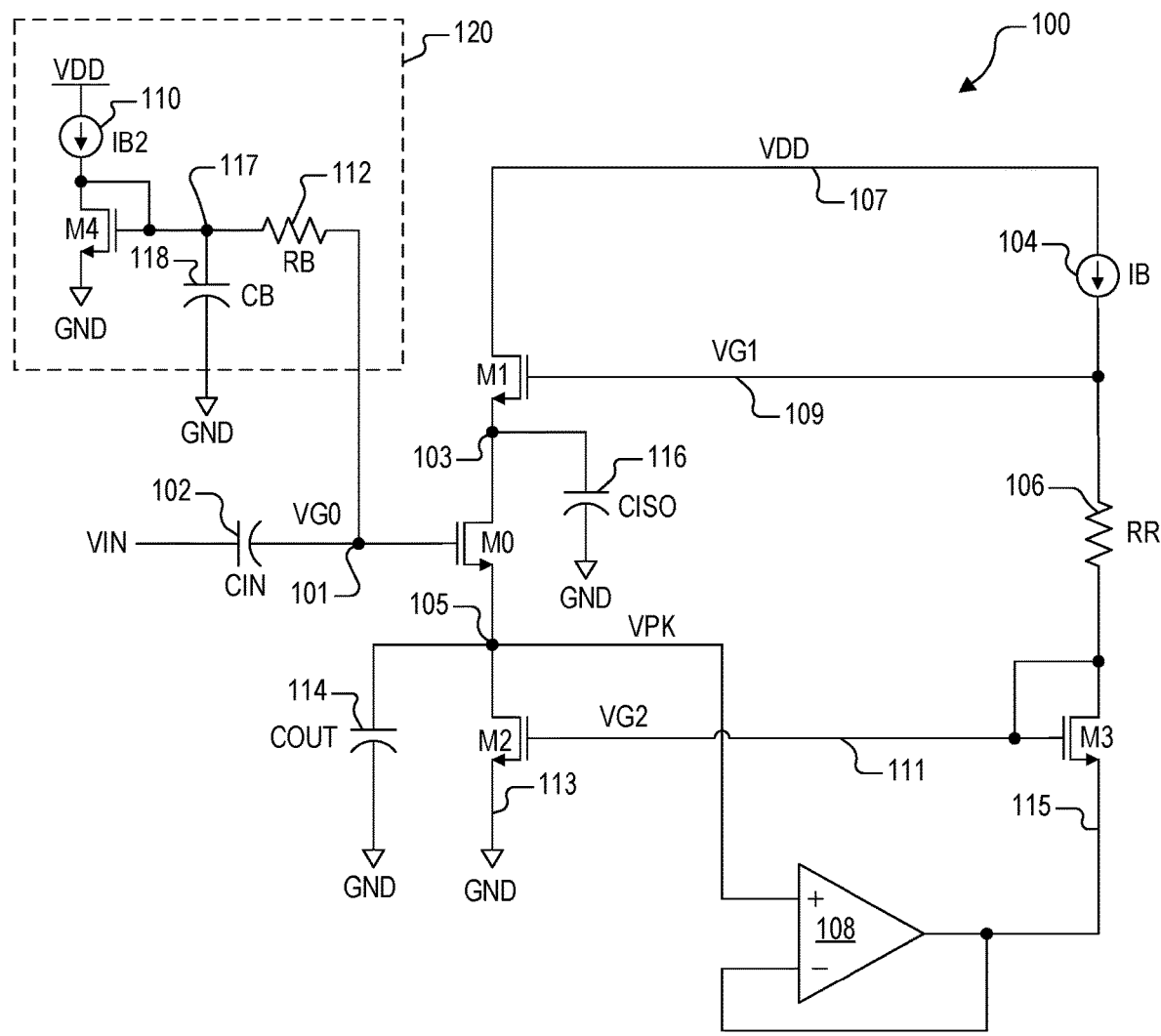
FIG. 1 is a schematic diagram of a peak detector implemented according to an embodiment of the present disclosure with a single input.

FIG. 1 is a schematic diagram of a peak detector 100 implemented according to an embodiment of the present disclosure. An input signal VIN is provided to one end of an input capacitor 102 having a capacitance CIN, in which the other end of the input capacitor 102 is coupled to an input node 101. The input node 101 is coupled to the gate terminal of an input transistor M0 and develops a gate voltage VG0 for M0. M0 has a drain terminal coupled to an isolation node 103 and a source terminal coupled an output node 105 that develops an output signal VPK. An isolation transistor M1 has a drain terminal coupled to a supply voltage node 107 developing a supply voltage VDD, a source terminal coupled to the isolation node 103, and a gate terminal coupled to a gate node 109 developing a gate voltage VG1. A load transistor M2 has a drain terminal coupled to the output node 105, a gate terminal coupled to a gate node 111 developing a gate voltage VG2, and a source terminal coupled to a supply reference node 113. The supply reference node has any suitable positive, negative or zero supply reference voltage level, such as ground (GND).

A current source 104 has a first terminal coupled to VDD and a second terminal coupled to node 109, in which the current source 104 provides a bias current IB to node 109. A resistor 106 with a resistance RR is coupled between nodes 109 and 111. Another transistor M3 has a drain terminal and a gate terminal coupled together at node 111 and has a source terminal coupled to a buffer node 115 developing a voltage VPKO. An operational amplifier (OA) 108 has a positive (or noninverting) input coupled to the output node 105 and has a negative (or inverting) input and an output coupled together at the buffer node 115. The OA 108 is configured as a unity gain buffer for driving the buffer node 115 at substantially the same voltage as the output node 105, or VPKO≈VPK (in which "≈" means equal or substantially equal). Additional capacitors may be provided. As shown, for example, an output capacitor 114 having a capacitance COUT is coupled between the output node 105 and GND, and an isolation capacitor 116 having a capacitance CISO is coupled between the isolation node 103 and GND.

An input bias circuit 120 may be provided for biasing the input node 101 at a predetermined nominal direct-current (DC) voltage level, including a current source 110, a bias transistor M4, a resistor 112 with resistance RB and a capacitor 118 with capacitance CB. The current source 110 has a first terminal coupled to VDD and a second terminal coupled to a bias node 117, in which the current source 110 provides a bias current IB2 to node 117. M4 has a drain terminal and a gate terminal coupled to the bias node 117 and has a source terminal coupled to GND. The resistor 112 is coupled between the bias node 117 and the input node 101. The capacitor 118 is coupled between the bias node 117 and GND.

Each of the transistors M0, M1, M2, M3, and M4 are shown as N-channel MOS transistors having drain and source terminals as current terminals and having a gate terminal as a control terminal, in which it is understood that alternative types of transistors may be used. M3 is configured to match M2 so that their threshold voltages (VTH) are substantially equal, or VTH3≈VTH2. Also, M4 is configured to match M0 so that VTH4≈VTH0. M4 generates a bias voltage of about VTH4 and since VTH0≈VTH4, VG0=VINPK+VTH0 in which VINPK is the actual peak voltage of VIN.

In operation, VG2 is established so that M2 remains biased into its triode region and does not exhibit the VDS modulation effect. In particular, M3 generates VG2=VPKO+VTH2 (since M3 matches M2). The drain current of M2 is ID2=K2*(VGS2−VTH2)*VDS2=K2*VPKO*VPK, so that ID2∝VPK$^2$, in which K2 is a constant based on physical configuration of M2, VGS2 is the gate-to-source voltage of M2, VTH2 is the threshold voltage of M2, and VDS2 is the drain-to-source voltage of M2. The OA 108 operating as a unity gain buffer helps to establish ID2∝VPK$^2$ since VPK VPKO. M0 operates in the saturation region in which the drain current of M0 is ID0=K0*(VGS0−VTH0)$^2$=K0*(VINPK−VPK)$^2$ ∝ (VINPK−VPK)$^2$ where VGS0=VINPK+VTH0−VPK, in which K0 is a constant based on physical configuration of M0, VGS0 is the gate-to-source voltage of M0, VTH0 is the threshold voltage of M0, and VINPK is the actual peak voltage of VIN.

When the peak detector 100 reaches a steady state condition, the charging from M1 is equal to the discharging from M2. In this manner, VINPK−VPK=K00*VPK and VPK=K01*VINPK so that VPK (and thus VPKO) are proportional to VINPK, where K00 and K01 are constants. The gate voltage of M1 is VG1=VPKO+VTH3+IB*RR and the drain voltage of M0 is VD0=VG1−VTH1, so that VD0=VPKO+IB*RR with VTH1 VTH3, where VTH1 is the threshold voltage of M1, and VTH3 is the threshold voltage of M3. Then the drain-to-source voltage of M0 is VDS0=VD0−VPK=IB*RR which is constant since IB is proportional to VBG/RR and VBG is a constant bandgap reference voltage. In this manner, M0 does not have the VDS modulation effect. The source voltage VDD is isolated from M0 and M2 by M1 and the current source 104 so that the peak detector 100 has a good (e.g., relatively high) power supply rejection ratio (PSRR). It is noted that VPKO is buffered and may be used as the output for further processing, so that VPK is protected from outside interference.

M0 is configured as a source follower device, and M2 is biased to operate in its triode region as a nonlinear resistor load for M0. The voltage of VG2 biases the gate terminal of M2 using a buffered version of the output voltage VPK corrects any nonlinearity of M0 and M2 to produce an overall linear behavior of the peak detector 100, and also provides process insensitivity. The biasing of M1 via VG1 allows the signal level of VPK and also enables the drain current VDS1 of M1 to be insensitive to process/voltage/temperature (PVT) variations. The OA 108 serving as a unity-gain buffer buffers VPK rather than VIN. Although VIN may be a radio frequency (RF) signal, VPK has a DC voltage characteristic, so that the configuration of OA 108 may be relatively simple since not buffering higher frequency levels.

It is noted that VPK may actually be proportional to VINPK+VOFF in which VOFF may be produced at zero input. VOFF is an error value generated by any mismatching, such as when M2 and M3 do not perfectly match, or when M0 and M4 do not perfectly match, along with any offset voltage generated by the OA 108 and any other circuitry components. Compensation circuitry (not shown) such as using one or more trimming resistances may be included to minimize VOFF or to reduce VOFF to an acceptable level for a particular configuration.

Figure 2:
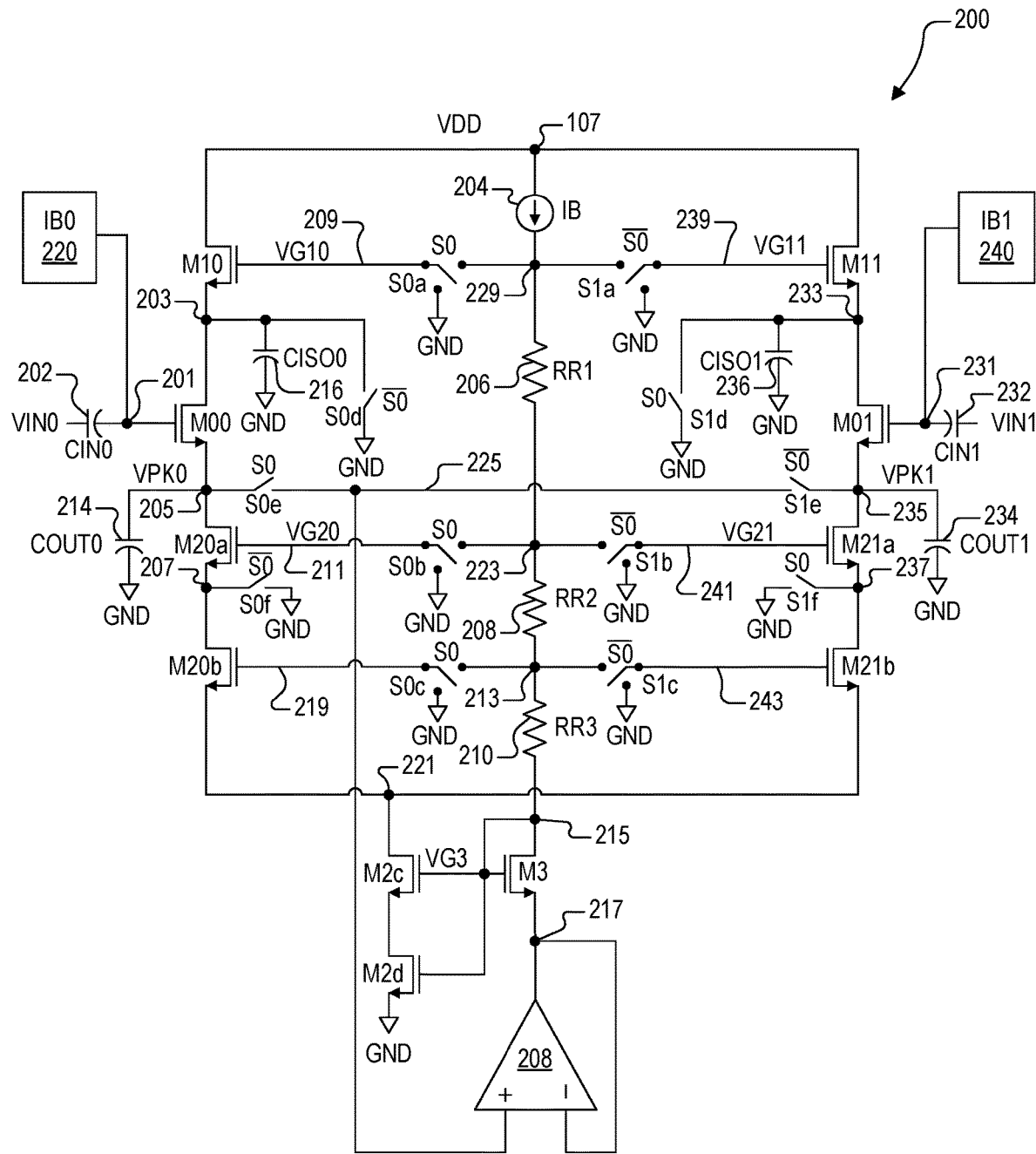
FIG. 2 is a schematic diagram of a peak detector implemented according to another embodiment of the present disclosure with a pair of switched inputs.

FIG. 2 is a schematic diagram of a peak detector 200 implemented according to another embodiment of the present disclosure including a pair of switched inputs. The peak detector 200 operates in a similar manner as the peak detector 100 except that it is configured for 2 inputs rather than one. In particular, separate inputs VIN0 and VIN1 are detected one at a time based on switch control signals S0 and $\overline{S0}$ that control a set of switches, in which the switch arrangement minimizes coupling between VIN0 & VIN1. The peak detector 200 includes shared circuitry for saving power and circuit area. In one embodiment, the input VIN0 represents a signal voltage (V) and VIN1 represents the signal current (I), so that power (P) may be easily determined.

The input signal VIN0 is provided to one end of an input capacitor 202 having a capacitance CIN0, in which the other end of the input capacitor 202 is coupled to a first input node 201. An input bias circuit 220 is coupled to node 201 for biasing the input node 201 at a predetermined nominal DC voltage level, in which the input bias circuit 220 may be configured in a substantially identical manner as the input bias circuit 120. The input node 201 is further coupled to a gate terminal of an input transistor M00, which has a drain terminal coupled to an isolation node 203 and a source terminal coupled to an output node 205 that develops a first output signal VPK0. An isolation transistor M10 has a drain terminal coupled to VDD, a source terminal coupled to the isolation node 203, and a gate terminal coupled to a gate node 209 that develops a gate voltage VG10. A first load transistor M20a has a drain terminal coupled to the output node 205, a gate terminal coupled to a second gate node 211 that develops a gate voltage VG20, and a source terminal coupled to a node 207.

The load transistor of the peak detector 200 for detecting VIN0, which was depicted as a single transistor M2 for the peak detector 100, includes multiple load transistors M20a, M20b, M2c and M2d stacked together between the output node 205 and GND. The second load transistor M20b has a drain terminal coupled to node 207, a gate terminal coupled to a node 219, and a source terminal coupled to a common current node 221. The third load transistor M2c has a drain terminal coupled to a node 221, a gate terminal coupled to a common gate node 215 that develops a gate voltage VG3, and a source terminal. The fourth load transistor M2d has a drain terminal coupled to the source terminal of M2c, a gate terminal coupled to node 215, and a source terminal coupled to GND.

A current source 204 has a first terminal coupled to VDD and a second terminal coupled to a switched gate node 229, in which the current source 204 provides a bias current IB to node 229. A first resistor 206 with a resistance RR1 is coupled between node 229 and another switched gate node 223, a second resistor 208 with a resistance RR2 is coupled between node 223 and another switched gate node 213, and a third resistor 210 with a resistance RR3 is coupled between nodes 213 and 215. A transistor M3 has a drain terminal and a gate terminal coupled together at node 215 and has a source terminal coupled to a buffer node 217 developing a buffered output voltage VPK0. An OA 208 is configured as a unity gain buffer having a positive input coupled to a switched output node 225 and having a negative input and an output coupled together at the buffered output node 217. Additional capacitors may be provided. As shown, for example, an output capacitor 214 having a capacitance COUT0 is coupled between the output node 205 and GND, and an isolation capacitor 216 having a capacitance CISO0 is coupled between the isolation node 203 and GND.

The input signal VIN1 is provided to one end of an input capacitor 232 having a capacitance CIN1, in which the other end of the input capacitor 232 is coupled to a second input node 231. Another input bias circuit 240 is coupled to node 231 for biasing the input node 231 at a predetermined nominal DC voltage level, in which the input bias circuit 240 may be configured in a substantially identical manner as the input bias circuit 120. The input node 231 is further coupled to a gate terminal of an input transistor M01, which has a drain terminal coupled to an isolation node 233 and a source terminal coupled to the output node 235 that develops the second output signal VPK1. An isolation transistor M11 has a drain terminal coupled to VDD, a source terminal coupled to the isolation node 233, and a gate terminal coupled to a gate node 239 that develops a gate voltage VG11. A first load transistor M21a has a drain terminal coupled to the output node 235, a gate terminal coupled to a gate node 241 that develops a gate voltage VG21, and a source terminal coupled to a node 237.

The load transistor of the peak detector 200 for detecting VIN1 also includes multiple load transistors M21a, M21b, M2c and M2d in a stacked configuration, in which M2c and M2d are shared between the inputs VIN0 and VIN1. The second load transistor M21b has a drain terminal coupled to node 237, a gate terminal coupled to a node 243, and a source terminal coupled to the node 221. Additional capacitors may be provided. As shown, for example, an output capacitor 234 having a capacitance COUT1 is coupled between the output node 235 and GND, and an isolation capacitor 236 having a capacitance CISO1 is coupled between the isolation node 233 and GND.

The set of switches includes single-pole, double throw (SPDT) switches S0a, S0b, S0c, S1a, S1b, and S1c, and single-pole, single throw (SPST) switches S0d, S0e, S0f, S1d, S1e, and S1f. Each of the SPDT switches may be implemented using two separate switches, and each of the switches may be implemented as MOS type transistor devices or the like. The switches S0a, S0b, S0c, S0e, S1d, and S1f are controlled by the switch control signal S0, while the switches S1a, S1b, S1c, S1e, S0d, and S0f are controlled by the switch control signal $\overline{S0}$. The switch control signals S0 and $\overline{S0}$ are complimentary signals such that when S0 is asserted high, $\overline{S0}$ is de-asserted low, and vice-versa.

When S0 is asserted (and $\overline{S0}$ is de-asserted) for selecting VIN0 for peak detection, node 209 is coupled to node 229, node 211 is coupled to node 223, node 219 is coupled to node 213, and node 205 is coupled to node 225, whereas nodes 239, 241, 243, 233, and 237 are coupled to GND. When S0 is de-asserted (and $\overline{S0}$ is asserted) for selecting VIN1 for peak detection, node 239 is coupled to node 229, node 241 is coupled to node 223, node 249 is coupled to node 213, and node 235 is coupled to node 225, whereas nodes 209, 211, 219, 203, and 207 are coupled to GND.

In the switched configuration, the current source 204, the resistors 206 (resistance RR1), 208 (resistance RR2), and resistor 210 (resistance RR3), the transistors M2c, M2d, and M3, and the OA 208 are shared between the two input circuits for detecting VIN0 and VIN1, respectively, in which each input circuit is similar or even substantially the same. The gate nodes 209, 211, and 219 form a first gate node set for the first input circuit, and the gate nodes 239, 241, and 243 form a second gate node set for the second input circuit. Although only two input circuits are shown, it is understood that any number of substantially identical input circuits may be included for detecting the peak of any number input signals. The shared devices save circuit area, particularly the shared load transistors M2c and M2d, which may also be referred to as common load transistors having gate terminals coupled to the common gate node 215, and each having drain and source terminals coupled in series between the common current node 221 and GND.

In an alternative configuration, the input transistors M2c and M2d may also be split between the input circuits, such as a pair of transistors M20c and M20d (not shown) for the VIN0 input circuit and a pair of transistors M21c and M21d (not shown) for the VIN1 input circuit, in which the common current node 221 would also be split into two separate current nodes. In this case, the common gate node 215 may instead be one or more switched gate nodes including a last switched gate node for switching between the two input circuits. In addition, the pair of transistors M20c and M20d may be coupled to a corresponding pair of switched gate nodes or may be coupled together at the same switched gate node, and the pair of transistors M21c and M21d may be coupled to a corresponding pair of switched gate nodes or may be coupled together at the same switched gate node.

When S0 is asserted to detect VIN0 for developing the peak output voltage VPKO, the output node 205 is coupled to the switched output node 225 so that the OA 208 drives the buffer node 217 at substantially the same voltage as the output node 205, or VPKO VPKO. When S0 is asserted to detect VIN1 for developing a peak output voltage VPK1 on the output node 235, the output node 235 is coupled to the switched output node 225 so that the OA 208 drives the buffer node 217 at substantially the same voltage as the output node 235, or VPKO VPK1. When determining power, the peak voltage VPKO of VIN0 may be measured as VPKO0 representing a signal's voltage, whereas the peak voltage VPK1 of VIN1 may be measured as VPKO1 representing the signal's current in which VPKO1=$I_{PK}*R_{CONSTANT}$. In this manner, the signal's power (P) is easily determined as P=VPKO0*VPKO1.

Each of the transistors M00, M01, M10, M11, M20a, M20b, M2c, M2d, M21a, M21b, and M3 are shown as N-channel MOS transistors having drain and source terminals as current terminals and having a gate terminal as a control terminal, in which it is understood that alternative types of transistors may be used. M3 is diode-coupled having its drain and gate terminals coupled together to operate similar to a resistive device.

Operation of the peak detector 200 for each input is similar to that of the peak detector 100. In a similar manner as described for the peak detector 100, when VIN0 is selected, the transistor M00 maintains operation in the saturation region and does not exhibit the VDS modulation effect. Each of the load transistors M20a, M20b, M2c, and M2d maintain operation in the triode region and do not exhibit the VDS modulation effect. M10 provides isolation from VDD resulting in good (e.g., sufficiently high) PSRR. When VIN1 is selected, the transistor M01 maintains operation in the saturation region and does not exhibit the VDS modulation effect. Each of the load transistors M21a, M21b, M2c, and M2d maintain operation in the triode region and do not exhibit the VDS modulation effect. M11 provides isolation from VDD resulting in good PSRR. The OA 208 buffers VPKO for each input and is suitable for further processing, whereas VPKO and VPK1 remain protected from outside interference.

In a more specific configuration, in order for VPK to have a sufficient voltage level at zero input (e.g., VIN=0V) for the OA 208 to function properly, such as VPK>60 millivolts (mV), M2 should have a sufficiently large drain-source resistance (RDS2) and thus a relatively long channel length L. In this manner, M2 is split into a stack of transistors shown as M20a, M20b, M2c and M2d (for VIN0) and M21a, M21b, M2c and M2d (for VIN1), in which M2c and M2d are shared between the inputs to save circuit area. M3 is used to bias each of M2c and M2d into the triode region, M3 and RR3 are used to bias M20b or M21b into the triode region, and M3 and RR3 and RR2 are used to bias M20a or M21a into the triode region. In one specific embodiment, M2 is split into 24 smaller transistors for each input branch including 4 transistors for each separate branch and 20 transistors for the combined branch), including 2 transistors for each of M20a, M20b, M21a, and M21b, and 10 transistors for each of M2c and M2d.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A peak detector, comprising:
    an input transistor having a control terminal coupled to an input node, having a first current terminal coupled to an isolation node and having a second current terminal coupled to an output node;
    an isolation transistor having current terminals coupled between a supply voltage and the isolation node and having a control terminal coupled to a first gate node of a plurality of gate nodes;
    at least one load transistor each having current terminals coupled between the output node and a supply reference node and having a control terminal coupled to a corresponding one of the plurality of gate nodes;
    a buffer having an input coupled to the output node and having an output coupled to a buffer node;
    a control transistor having a control terminal and a first current terminal coupled to a last gate node of the plurality of gate nodes and having a second current terminal coupled to the buffer node;
    a current source that is configured to provide a bias current into the first gate node; and
    at least one resistor coupled between the first gate node and the last gate node.

2. The peak detector of claim 1, further comprising an input capacitor having a first terminal receiving an input signal and having a second terminal coupled to the input node.

3. The peak detector of claim 1, wherein the input transistor comprises an NMOS transistor having a drain terminal coupled to the isolation node, having a gate terminal coupled to the input node, and having a source terminal coupled to the output node, and wherein the input transistor is biased in a saturation region.

4. The peak detector of claim 1, wherein each at least one load transistor comprises an NMOS transistor having a drain terminal coupled to the output node, having a gate terminal coupled to a corresponding gate node, and having a source terminal coupled to the supply reference node, and wherein the load transistor is biased in a triode region.

5. The peak detector of claim 1, wherein the isolation transistor comprises an NMOS transistor having a drain terminal coupled to the supply voltage, a gate terminal coupled to the first gate node, and a source terminal coupled to the isolation node.

6. The peak detector of claim 1, wherein the control transistor comprises an NMOS transistor having a drain terminal and a gate terminal coupled together at the last gate node and having a source terminal coupled to the buffer node.

7. The peak detector of claim 6, wherein each load transistor comprises an NMOS transistor having a drain terminal coupled to the output node, having a gate terminal coupled to at least one of the plurality of gate nodes, and having a source terminal coupled to the supply reference node, and wherein the control transistor matches the at least one load transistor with matching threshold voltages.

8. The peak detector of claim 1, wherein the buffer comprises a unity gain buffer having a negative input and an output coupled together at the buffer node and having a positive input coupled to the output node.

9. The peak detector of claim 1, wherein the isolation transistor and the current source are configured to isolate the input transistor from the supply voltage to provide power supply rejection.

10. The peak detector of claim 1, further comprising an input bias circuit that is configured to bias the input node at a predetermined direct-current voltage level.

11. The peak detector of claim 1, further comprising:
 a second current source configured to provide current to a bias node;
 a bias transistor having a first current terminal and a control terminal coupled together at the bias node and having a second current terminal coupled to the supply reference node; and
 a second resistor coupled between the bias node and the input node.

12. The peak detector of claim 11, wherein the input transistor comprises an NMOS transistor having a drain terminal coupled to the isolation node, having a gate terminal coupled to the input node, and having a source terminal coupled to the output node, wherein the bias transistor comprises an NMOS transistor having a drain current terminal and a gate terminal coupled together at the bias node and having a source terminal coupled to the supply reference node, and wherein the bias transistor matches the input transistor with matching threshold voltages.

13. The peak detector of claim 1, wherein the buffer, the control transistor, the current source, and the at least one resistor collectively bias each load transistor with a buffered version of an output voltage generated on the output node to operate as a nonlinear resistor that corrects nonlinearities of the input transistor and each load transistor.

14. The peak detector of claim 1, wherein the buffer, the control transistor, the current source, and the at least one resistor collectively bias each load transistor so that it has a current that is proportional to the square of an output voltage on the output node in which the output voltage is proportional to a peak voltage of the input node.

15. A peak detector, comprising:
 a plurality of resistors coupled in series between a first switched gate node of a plurality of switched gate nodes and a common gate node, wherein intermediate junctions of the plurality of resistors are coupled to a corresponding one of the plurality of switched gate nodes;
 a current source that is configured to provide a bias current into the first switched gate node;
 a unity gain buffer having an input coupled to a switched output node and having an output coupled to a buffer node;
 a control transistor having a control terminal and a first current terminal coupled together at the common gate node and having a second current terminal coupled to the buffer node;
 at least one common load transistor, each having first and second current terminals coupled between a common current node and a supply reference node, and each having a control terminal coupled to the common gate node; and
 a plurality of input circuits, each comprising:

one of a plurality of input transistors having a control terminal coupled to a corresponding one of a plurality of input nodes, having a first current terminal coupled to a corresponding one of a plurality of isolation nodes and having a second current terminal coupled to a corresponding one of a plurality of output nodes;
 one of a plurality of isolation transistors having current terminals coupled between a supply voltage node and the corresponding isolation node and having a control terminal coupled to a first one of a plurality of gate nodes of a corresponding one of a plurality of gate node sets; and
 a plurality of load transistors, each having current terminals coupled between a corresponding output node and the common current node and having a control terminal coupled to one of the plurality of gate nodes of the corresponding gate node set; and
 switch circuitry that is configured to couple one of the plurality of output nodes to the switched output node, and to couple each of the plurality of switched gate nodes to a corresponding one of the plurality of gate nodes of a corresponding gate node set.

16. The peak detector of claim 15, wherein the current source, the plurality of resistors, the unity gain buffer, and the control resistor are collectively configured to bias the at least one common load transistor and the plurality of load resistors into a triode region and to bias said one of a plurality of input transistors into a saturation region.

17. The peak detector of claim 15, further comprising a plurality of input bias circuits for each of the plurality of input circuits, wherein each input bias circuit comprises:
 a corresponding one of a plurality of second current sources configured to provide current to a corresponding one of a plurality of bias nodes;
 one of a plurality of bias transistors having a first current terminal and a control terminal coupled together at the corresponding bias node and having a second current terminal coupled to the supply reference node; and
 one of a plurality of second resistors coupled between the corresponding bias node and a corresponding one of the plurality of input nodes.

18. The peak detector of claim 15, wherein said one of a plurality of isolation transistors and the current source are configured to isolate said one of a plurality of input transistors from a supply voltage to provide power supply rejection.

19. The peak detector of claim 15, wherein the buffer, the control transistor, the current source, and the plurality of resistors collectively bias the at least one common load transistor and the plurality of load transistors with a buffered version of an output voltage generated on the switched output node to operate as a nonlinear resistor that corrects nonlinearities of said one of a plurality of input transistors and the at least one common load transistor and the plurality of load transistors.

20. A peak detector, comprising:
 a plurality of resistors coupled in series between a first switched gate node and a last switched gate node of a plurality of switched gate nodes, wherein intermediate junctions of the plurality of resistors are coupled to a corresponding one of the plurality of switched gate nodes;
 a current source that is configured to provide a bias current into the first switched gate node;
 a buffer having an input coupled to a switched output node and having an output coupled to a buffer node;

a control transistor having a control terminal and a first current terminal coupled together at the last switched gate node and having a second current terminal coupled to the buffer node; and a plurality of input circuits, each comprising:
one of a plurality of input transistors having a control terminal coupled to a corresponding one of a plurality of input nodes, having a first current terminal coupled to a corresponding one of a plurality of isolation nodes and having a second current terminal coupled to a corresponding one of a plurality of output nodes;

one of a plurality of isolation transistors having current terminals coupled between a supply voltage node and the corresponding isolation node and having a control terminal coupled to a first one of a plurality of gate nodes of a corresponding one of a plurality of gate node sets; and a plurality of load transistors, each having current terminals coupled between a corresponding output node and a supply reference node and having a control terminal coupled to one of the plurality of gate nodes of the corresponding gate node set; and switch circuitry that is configured to couple one of the plurality of output nodes to the switched output node, and to couple each of the plurality of switched gate nodes to a corresponding one of the plurality of gate nodes of a corresponding gate node set.

* * * * *